(12) United States Patent
Nakabayashi

(10) Patent No.: US 8,169,230 B2
(45) Date of Patent: May 1, 2012

(54) SEMICONDUCTOR DEVICE AND METHOD OF TESTING THE SAME

(75) Inventor: Masahiko Nakabayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 219 days.

(21) Appl. No.: 12/589,000

(22) Filed: Nov. 4, 2009

(65) Prior Publication Data

US 2010/0117678 A1 May 13, 2010

(30) Foreign Application Priority Data

Nov. 11, 2008 (JP) ................................. 2008-289154

(51) Int. Cl.
*G01R 31/26* (2006.01)
*H01L 23/58* (2006.01)
(52) U.S. Cl. ..................................... 324/762.05; 257/48
(58) Field of Classification Search .................... None
See application file for complete search history.

(56) References Cited

U.S. PATENT DOCUMENTS 6,399,400 B1 * 6/2002 Osann et al. .................... 438/14

FOREIGN PATENT DOCUMENTS

| JP | 2001-135687 | | 5/2001 |
| JP | 2010118408 A | * | 5/2010 |

* cited by examiner

*Primary Examiner* — Paresh Patel
(74) *Attorney, Agent, or Firm* — McGinn IP Law Group PLLC

(57) ABSTRACT

A semiconductor device is formed on a semiconductor wafer. The semiconductor device has: an output buffer configured to externally output an output signal received from an internal circuit; an input buffer configured to output an input signal externally received to the internal circuit; a switch configured to control electrical connection between an output terminal of the output buffer and an input terminal of the input buffer; a first transmission path provided in a scribe region of the semiconductor wafer and connecting between the output terminal and the switch; and a second transmission path provided in the scribe region and connecting between the input terminal and the switch.

13 Claims, 4 Drawing Sheets

SEMICONDUCTOR DEVICE AND METHOD OF TESTING THE SAME

INCORPORATION BY REFERENCE

This application is based upon and claims the benefit of priority from Japanese patent application No. 2008-289154, filed on Nov. 11, 2008, the disclosure of which is incorporated herein in its entirety by reference.

BACKGROUND OF THE INVENTION

1. Field of the Invention

The present invention relates to a semiconductor device and a method of testing the semiconductor device. In particular, the present invention relates to a semiconductor device in which a semiconductor test is performed through an input buffer or an output buffer before a process of dicing a semiconductor wafer, and a method of testing the semiconductor device.

2. Description of Related Art

In a manufacturing stage, a semiconductor device is required to be tested at a real operation speed. Meanwhile, in recent years, a data transmission speed between the semiconductor device and an external device is getting higher. Therefore, there may be a case where an operation speed of an input/output circuit (input buffer, output buffer) is higher than that of a test signal and thus a test by means of an external tester becomes impossible.

Regarding such a semiconductor device, it is proposed to connect the input buffer and the output buffer of the input/output circuit and to perform a test of the semiconductor device by a loopback method. For example, Japanese Laid-Open Patent Application JP-2001-135687 discloses a semiconductor integrated circuit device, in which a loopback test is performed before a process of dicing a semiconductor wafer.

Referring to FIG. 1, the semiconductor integrated circuit device described in Japanese Laid-Open Patent Application JP-2001-135687 will be explained below. First, a control signal is input to a mode switch terminal 1 and thereby an operation mode is set to a test mode. In the test mode, a selector 6, which receives a normal operation signal output from an internal circuit 7 (output terminal O3-1) and a test signal output from a signal generation circuit 5 (output terminal O1), selects the latter one, i.e. the test signal. The selected test signal is input to a first target input/output buffer 10 (internal input terminal I6). Also, a multiplexer 8 receives a signal from a second target input/output buffer 11 (internal output terminal O7) and outputs the signal not to the internal circuit 7 (input terminal I3-2) but to a signal detection circuit 9 (input terminal I5).

Moreover, another control signal is input to a control terminal 2. This control signal is input to the first target input/output buffer 10 (control terminal CTL6), and to the second target input/output buffer 11 (control terminal CTL7) through an inverter 12. In response to the control signal, the first target input/output buffer 10 is set to an output state while the second target input/output buffer 11 is set to an input state. As a result, a tristate output buffer 10-1 in the first target input/output buffer 10 is set to the output state. Thus, a signal output from the signal generation circuit 5 and input to the internal input terminal I6 is output to a first external pad 15 through the tristate output buffer 10-1. On the other hand, a tristate output buffer 11-1 in the second target input/output buffer 11 is set to a high-impedance state. Thus, a signal input to an external input/output terminal IO7 through a second external pad 16 is input to the multiplexer 8 without being influenced by the tristate output buffer 11-1.

The first external pad 15 and the second external pad 16 are connected with each other through a transmission path 18. Therefore, in the case of the test mode, the test signal output from the signal generation circuit 5 (output terminal O1) is input to the signal detection circuit 9 through the first target input/output buffer 10 (output buffer 10-1), the transmission path 18 and the second target input/output buffer 11 (output buffer 11-2). Further, the test signal is frequency-divided in the signal detection circuit 9 and then output to a test output pad 17 through an output buffer 13.

The test signal output from the test output pad 17 is observed by a test apparatus such as an LSI tester. Consequently, it is possible to check whether or not a circuit operation of the output buffer 10-1 in the first target input/output buffer 10 is normal, to test signal transmission characteristics from the first external pad 15 to the second external pad 16 through the transmission path 18, to check whether or not a circuit operation of the input buffer 11-2 in the second target input/output buffer 11 is normal, and the like.

Referring to FIG. 1, the transmission path 18 (loop path) connecting between the output buffer 10-1 and the input buffer 11-2 is formed on a scribe region 19 of a semiconductor wafer. Therefore, as a result of dicing performed after the test, the transmission path 18 is cut off and hence the first external pad 15 and the second external pad 16 are electrically disconnected from each other. Moreover, after the dicing, a control signal is input to the mode switch terminal 1 and thereby an operation mode is set to a normal operation mode. In the normal operation mode, the first target input/output buffer 10 operates as an output buffer that receives an output signal from the internal circuit 7 and externally outputs the output signal, and the second target input/output buffer 11 operates as an input buffer that transmits an external signal to the internal circuit 7.

The inventor of the present application has recognized the following points. As described above, in the semiconductor integrated circuit shown in FIG. 1, the input buffer and the output buffer are connected with each other through the transmission path 18 formed in the scribe region 19. Therefore, it is possible before the dicing of the semiconductor wafer to test the high-speed operating input/output circuit. After the dicing of the semiconductor wafer, the transmission path 18 between the input buffer and the output buffer is cut off and the input/output circuit operates in the normal operation mode.

However, before the dicing process, the input buffer and the output buffer are always short-circuited through the transmission path 18. Therefore, it is not possible before the dicing to test an output level, an input level, an output impedance, an input impedance and the like. Also, it is not possible before the dicing to perform a function test of a semiconductor device including the input buffer, output buffer and internal circuit.

SUMMARY

In an aspect of the present invention, a semiconductor device formed on a semiconductor wafer is provided. The semiconductor device has: an output buffer configured to externally output an output signal received from an internal circuit; an input buffer configured to output an input signal externally received to the internal circuit; a switch configured to control electrical connection between an output terminal of the output buffer and an input terminal of the input buffer; a first transmission path provided in a scribe region of the semiconductor wafer and connecting between the output terminal and the switch; and a second transmission path provided in the scribe region and connecting between the input terminal and the switch.

In another aspect of the present invention, a method of testing a semiconductor device is provided. The semiconductor device, which is formed on a semiconductor wafer, has: an output buffer connected between an internal circuit and an output terminal; an input buffer connected between the internal circuit and an input terminal; a switch provided between the output terminal and the input terminal; a first transmission path connecting between the output terminal and the switch; and a second transmission path connecting between the input terminal and the switch. The method includes: controlling electrical connection between the output terminal and the input terminal by using the switch when performing a test of the semiconductor device before dicing the semiconductor wafer; and cutting off the first transmission path and the second transmission path at the dicing of the semiconductor wafer.

According to the semiconductor device and the method of testing the semiconductor device of the present invention, it is possible to perform a characteristic test using the output buffer or the input buffer, before the dicing of the semiconductor wafer.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device and a method of testing the semiconductor device according to an embodiment of the present invention will be described below with reference to FIGS. 2 and 3.

Figure 1:
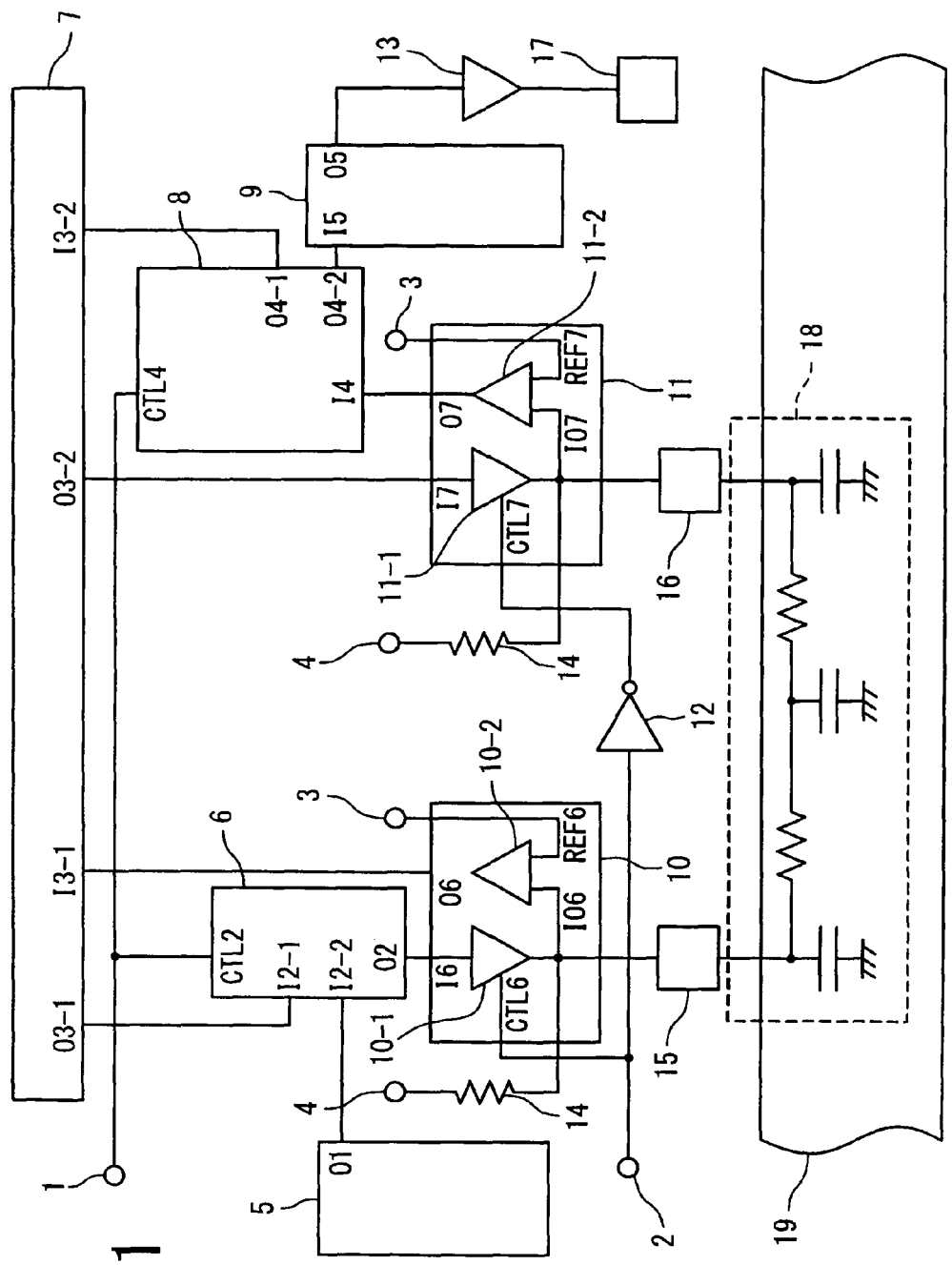
FIG. 1 is a block diagram showing a configuration of a semiconductor device according to a related technique.
Figure 2:
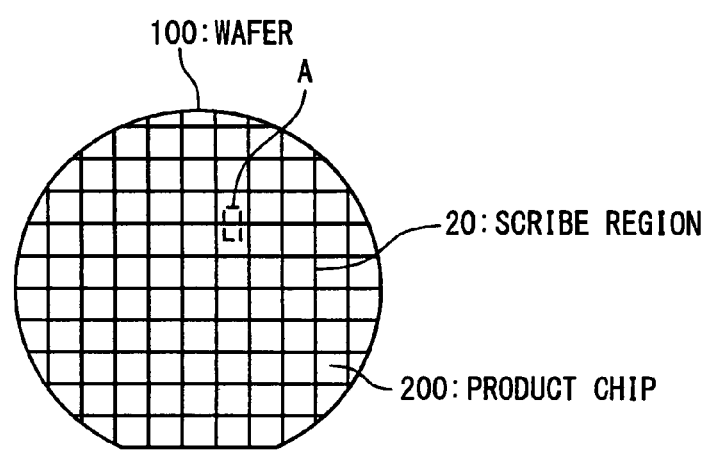
FIG. 2 is a diagram showing a structure of a semiconductor wafer according to the present invention.

FIG. 2 is a diagram showing a structure of a semiconductor wafer 100 (hereinafter referred to as a wafer 100) according to an embodiment of the present invention. As shown in FIG. 2, a plurality of semiconductor chips 200 (hereinafter referred to as product chips 200) and a scribe region 20 are formed on the wafer 100. The scribe region 20 is provided between adjacent product chips 200, and each product chip 200 is surrounded by the scribe region 20. At the dicing process, the wafer 100 is diced along the scribe region 20 and the plurality of product chips 200 are separated from each other.

Figure 3:
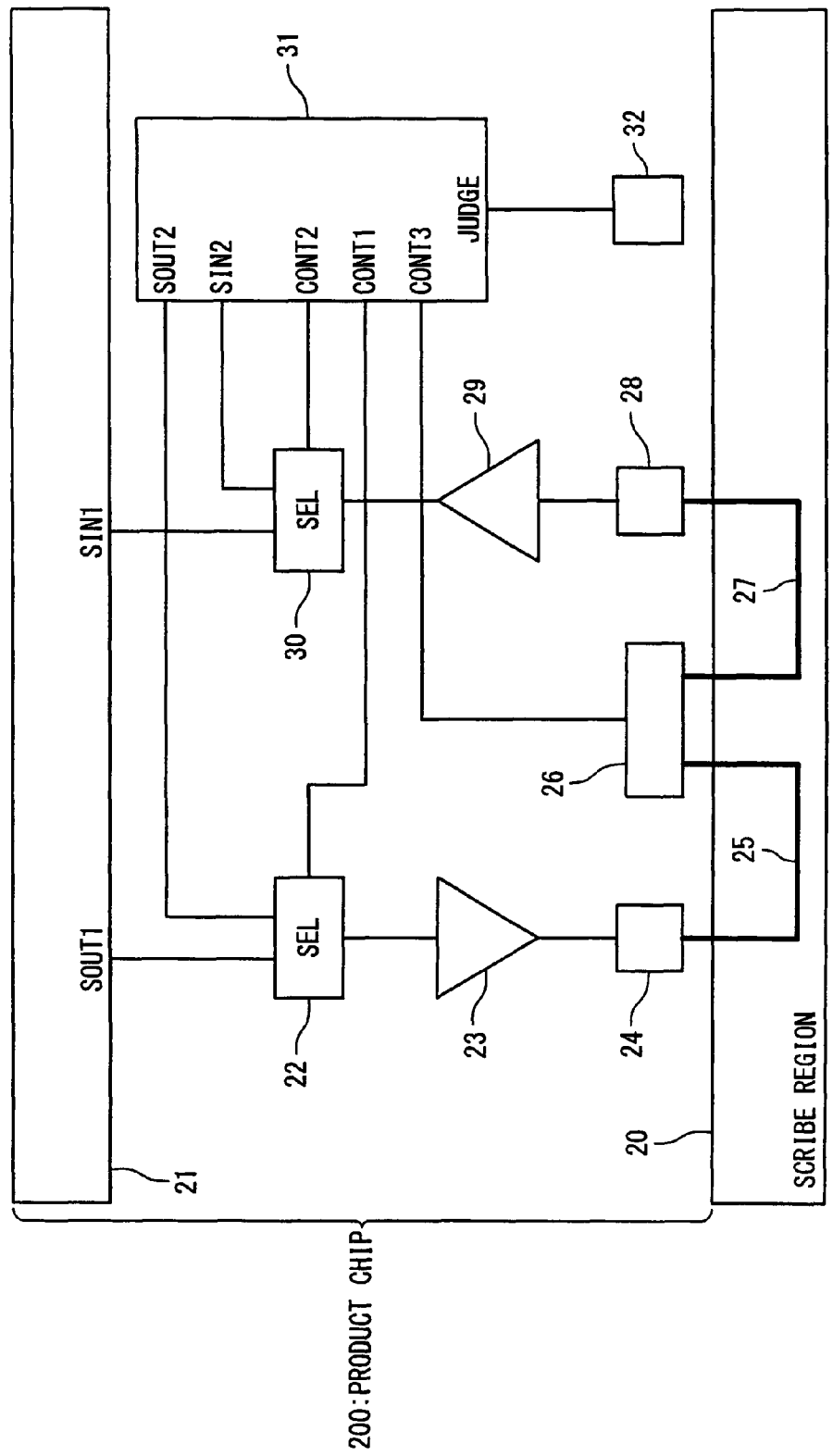
FIG. 3 is a block diagram showing an example of a configuration of a semiconductor device according to the present invention.

FIG. 3 is a block diagram showing a configuration in a region A in FIG. 2. As shown in FIG. 3, the product chip 200 has an internal circuit 21, a selector 22 (first selector), a selector 30 (second selector), an output buffer 23, an external output terminal pad 24 (hereinafter referred to as an output terminal 24), an input buffer 29, an external input terminal pad 28 (hereinafter referred to as an input terminal 28), a switch 26, a test control circuit 31 and a test output terminal pad 32 (hereinafter referred to as a test terminal 32). Moreover, a transmission path 25 is provided between the output terminal 24 and one end of the switch 26, and a transmission path 27 is provided between the input terminal 28 and the other end of the switch 26. At least a part of each of the transmission paths 25 and 27 is formed within the scribe region 20.

The test control circuit 31 is configured to switch an operation mode between a normal mode and a test mode, to control the selector 22, the selector 30 and the switch 26, and to generate and analyze a test signal. According to the present embodiment, the test mode includes: a first test mode for performing a loopback test; and a second test mode for performing another test that does not require a loop path described later. For example, the test performed in the second test mode includes a functional test of the internal circuit 21, the output buffer 23 and the input buffer 29.

The test control circuit 31 outputs a control signal CONT1 (first control signal) depending on the operation mode to the selector 22 to control a selection operation of the selector 22. Moreover, the test control circuit 31 outputs a control signal CONT2 (second control signal) depending on the operation mode to the selector 30 to control a selection operation of the selector 30. Furthermore, the test control circuit 31 outputs a control signal CONT3 (third control signal) depending on the operation mode to the switch 26 to control a switching operation of the switch 26.

The selector 22 is provided between the internal circuit 21, the test control circuit 31 and an input terminal of the output buffer 23. The selector 22 is configured to receive an output signal SOUT1 output from the internal circuit 21 and a test signal SOUT2 output from the test control circuit 31. The selector 22 selects, depending on the control signal CONT1, one of the output signal SOUT1 and the test signal SOUT2, and outputs the selected one to the output buffer 23. More specifically, in the case of the first test mode, the selector 22 selects the test signal SOUT2 and outputs it to the output buffer 23. On the other hand, in the cases of the normal mode and the second test mode, the selector 22 selects the output signal SOUT1 and outputs it to the output buffer 23.

The selector 30 is provided between the internal circuit 21, the test control circuit 31 and an output terminal of the input buffer 29. An input signal input to the input terminal 28 is transmitted to the selector 30 through the input buffer 29. That is, the selector 30 receives the input signal from the input buffer 29. The selector 30 selects, depending on the control signal CONT2, one of the internal circuit 21 and the test control circuit 31, and outputs the input signal to the selected one. More specifically, in the case of the first test mode, the selector 30 selects the test control circuit 31 and outputs the input signal to the test control circuit 31. On the other hand, in the cases of the normal mode and the second test mode, the selector 30 selects the internal circuit 21 and outputs the input signal to the internal circuit 21.

The output buffer 23 receives a signal from the selector 22 and externally outputs the signal through the output terminal 24. In the case of the first test mode, the output buffer 23 outputs the test signal SOUT2 that is output from the test control circuit 31. On the other hand, in the cases of the normal mode and the second test mode, the output buffer 23 outputs the output signal SOUT1 that is output from the internal circuit 21. The input buffer 29 externally receives an input signal through the input terminal 28, and outputs the input signal to the internal circuit 21 or the test control circuit 31 through the selector 30. In the case of the first test mode, the input signal input to the input buffer 29 through the input terminal 28 is output to the test control circuit 31. On the other hand, in the cases of the normal mode and the second test mode, the input signal is output to the internal circuit 21. The output buffer 23 and the input buffer 29 may operate at a higher speed than a test data transmission speed by an external tester.

The switch 26 receives the control signal CONT3 from the test control circuit 31. Depending on the control signal CONT3, the switch 26 controls electrical connection between the transmission path 25 (output terminal 24) and the transmission path 27 (input terminal 28). For example, the switch 26 includes a MOS (Metal Oxide Semiconductor) transistor. One of a source and a drain of the MOS transistor is connected to the transmission path 25, and the other thereof is connected to the transmission path 27. The control signal CONT3 is input to a gate of the MOS transistor. The MOS transistor used as the switch 26 can be an N-channel one, a P-channel one or a combination of them (transfer gate).

The transmission path 25, which is partially or wholly provided in the scribe region 20, is an interconnection that electrically connects between the output terminal 24 and the switch 26. The transmission path 27, which is partially or wholly provided in the scribe region 20, is an interconnection that electrically connects between the input terminal 28 and the switch 26. In the case of the first test mode, the switch 26 electrically connects the transmission path 25 and the transmission path 27 with each other in accordance with the control signal CONT3. In this case, a loop path that electrically connects between the output terminal 24 of the output buffer 23 and the input terminal 28 of the input buffer 29 is formed. On the other hand, in the case of the second test mode, the switch 26 cuts off the electrical connection between the transmission path 25 and the transmission path 27 in accordance with the control signal CONT3. Consequently, the output terminal 24 of the output buffer 23 and the input terminal 28 of the input buffer 29 are electrically disconnected from each other. In this case, it is possible to perform a test that does not require the loop path, such as an input/output characteristics test and a function test.

A method of testing the semiconductor device according to the present embodiment will be described below in detail with reference to FIG. 3. According to the present embodiment, it is possible before dicing the wafer 100 to perform not only the loopback test at a real operation speed in the product chip 200 but also various tests through the input/output circuit (the input buffer 29 and the output buffer 23) by the use of an external tester.

<First Test Mode, Loopback Test, Built-in Self Test>

In the first test mode, the switch 26 electrically connects between the transmission path 25 (output terminal 24) and the transmission path 27 (input terminal 28). As a result, the loop path that electrically connects between the output buffer 23 (output terminal 24) and the input buffer 29 (input terminal 28) is formed. The loop path passes through the output buffer 23 and the input buffer 29. The test control circuit 31 outputs the test signal SOUT2 to the selector 22. The selector 22 outputs the test signal SOUT2 to the output buffer 23, and the output buffer 23 outputs the test signal SOUT2 to the loop path. The test signal SOUT2 is transmitted to the input buffer 29 through the loop path (transmission paths 25 and 27). The input buffer 29 outputs the input test signal SOUT2 to the selector 30. The selector 30 selects the test control circuit 31 and outputs the received signal SOUT2 as a test signal SIN2 to the test control circuit 31. The test control circuit 31 makes a comparison between the test signal SOUT2 output to the output buffer 23 and the test signal SIN2 input from the input buffer 29, and then outputs a result of the comparison as a judgment signal JUDGE to the test terminal 32. The test control circuit 31 may judge whether or not an input/output characteristic is a desired one based on the result of the comparison and output a result of the judgment as the judgment signal JUDGE to the test terminal 32.

The judgment signal JUDGE is externally output through the test terminal 32. The judgment signal JUDGE is detected and analyzed by an external tester (not shown) connected to the test terminal 32. In this manner, the loopback test can be achieved, and the signal transmission characteristic from the output buffer 23 to the input buffer 29 can be analyzed. The loopback test can be performed in the product chip 200 at the real operation speed. Even if the operation speed of the input/output circuit (input buffer 29, output buffer 23) is high, it is possible to test the input/output characteristics of the input/output circuit.

<Second Test Mode, External Test without Using Loop Path>

According to the present embodiment, it is possible before the dicing process to cut off the loop path connecting between the output buffer 23 and the input buffer 29 by using the switch 26. It is thus possible before the dicing process to perform tests that do not require the loop path. For example, external tests of an output level, an input level, an output impedance, an input impedance and the like of the semiconductor device (product chip 200) can be performed before the dicing process. Moreover, a function test of the semiconductor device including the input buffer 29, the output buffer 23 and the internal circuit 21 can be performed before the dicing process. Here, the output buffer 23 and the input buffer 29 may be other than the target of the high-speed test.

A termination resistor (not shown) for impedance matching with the external transmission path may be connected to the input terminal 28 of the input buffer 29. In this case, if the output buffer 23 and the input buffer 29 are electrically connected with each other through the loop path, the output level and the output impedance of the output buffer 23 cannot be measured correctly due to a current flowing through the termination resistance. Therefore, according to the present embodiment, the output terminal 24 and the input terminal 28 are electrically disconnected from each other by using the switch 26, when the output level and the output impedance of the product chip 200 (output buffer 23) are measured. In this case, the internal circuit 21 outputs the output signal SOUT1 (High level or Low level) to the selector 22, the selector 22 selects the output signal SOUT1 in accordance with the control signal CONT1 and outputs the output signal SOUT1 to the output buffer 23. An external tester (not shown) is connected to the output terminal 24. The external tester detects and analyzes the output signal output from the output buffer 23. Consequently, it is possible to measure the output level and the output impedance of the output buffer 23 in response to the output signal SOUT1.

Similarly, if the output buffer 23 and the input buffer 29 are electrically connected with each other through the loop path, the input level and the input impedance of the product chip 200 (input buffer 29) cannot be measured correctly. Therefore, according to the present embodiment, the output terminal 24 and the input terminal 28 are electrically disconnected from each other by using the switch 26, when the input level and the input impedance of the product chip 200 (input buffer 29) are measured. In this case, an external tester (not shown) is connected to the input terminal 28, and a test signal (High level or Low level) is input to the input terminal 28 from the external tester. The test signal externally input to the input terminal 28 is transmitted as an input signal SIN1 to the internal circuit 21 through the input buffer 29 and the selector 30. The input level (input operational range) and the input impedance of the input buffer 29 in response to the test signal are measured by the external tester connected to the input terminal 28.

Moreover, it is possible to perform a function test, when the output buffer 23 and the input buffer 29 are electrically disconnected from each other by using the switch 26. More specifically, an external tester (not shown) is connected to the output terminal 24 or another output terminal and the input terminal 28 or another input terminal. The external tester supplies a test pattern signal to the connected input terminal. The internal circuit 21 outputs a pattern signal depending on the input test pattern signal. The pattern signal is output to the external tester through the connected output terminal. The external tester or an analyzer analyzes the output pattern signal and judges whether or not the output pattern signal is a desired pattern.

According to the present embodiment, as described above, the switch 26 for controlling the electrical connection of the loop path is provided on the loop path. It is therefore possible before the dicing of the wafer 100 to perform not only the loopback test but also the input/output characteristics test and the function test of the product chip 200.

After the above-mentioned tests are completed, the dicing of the wafer 100 is performed to divide the wafer 100 into the product chips 200. At this time, the transmission paths 25 and 27 formed on the scribe region 20 are cut off. In other words, the loop path between the output terminal 24 and the input terminal 28 are cut off (removed) by the dicing. The electrical connection between the output terminal 24 and the switch 26 and the electrical connection between the input terminal 28 and the switch 26 are cut off by the dicing.

If the electrical connection between the switch 26 and the output terminal 24 or the input terminal 28 is maintained after the dicing, the switch 26 may cause deterioration of characteristics of the product chip 200. For example, a leakage current may be caused even if the switch 26 is turned OFF, malfunction may be caused due to defect of the switch 26, or high-frequency characteristics may be deteriorated due to parasitic capacitance of the switch 26. According to the present embodiment, the dicing process completely eliminates the electrical connection between the output terminal 24 (output buffer 23) and the switch 26 and the electrical connection between the input terminal 28 (input buffer 29) and the switch 26. Therefore, the above-mentioned problems due to the switch 26 can be prevented from occurrence.

According to the present embodiment, the transmission paths 25 and 27 forming the loop path are provided outside the product chip 200. Therefore, the loopback test can be achieved without increasing an area of the product chip 200.

After the dicing process, the product chip 200 (test control circuit 31) is set to the normal mode. In the case of the normal mode, the selector 22 selects the output signal SOUT1 received from the internal circuit 21 and outputs the output signal SOUT1 to the output buffer 23, in accordance with the control signal CONT1. The selector 30 outputs an signal received from the input buffer 29 as the input signal SIN1 to the internal circuit 21. In this manner, the output buffer 23 and the input buffer 29 respectively operate as normal input and output circuits in the product chip 200, after the dicing.

As described above, in the semiconductor device according to the present embodiment, it is possible before the dicing to perform the loopback test even if the input buffer and the output buffer whose operation speeds are faster than the signal speed of the tester and to perform various input/output characteristics tests and the function test by cutting off the loop path by the use of the switch 26. Therefore, whether the product chip 200 is a good one or a defective one can be determined even at the wafer stage, which can reduce the manufacturing cost.

Figure 4:
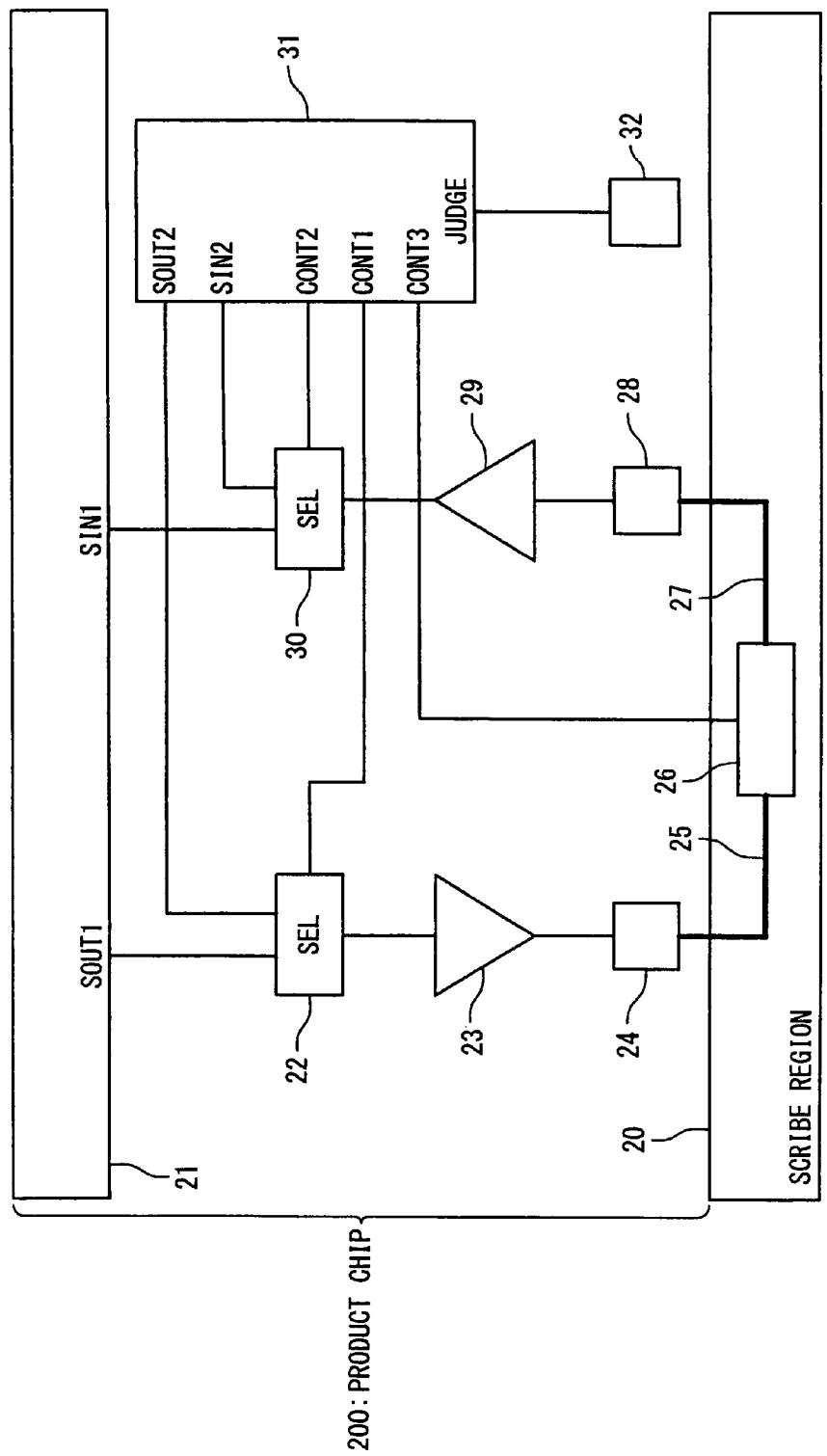
FIG. 4 is a block diagram showing another example of a configuration of a semiconductor device according to the present invention.

FIG. 4 shows a modification example of the semiconductor device according to the present embodiment. In FIG. 3, the switch 26 is provided within the product chip 200. In FIG. 4, however, the switch 26 is provided in the scribe region 20. Since the switch 26 is provided in the scribe region 20, the scribe region 20 is removed by the dicing process. Since the switch 26 is provided outside the product chip 200, a circuit area of the product chip 200 can be further reduced.

It is apparent that the present invention is not limited to the above embodiments and may be modified and changed without departing from the scope and spirit of the invention.

What is claimed is:

1. A semiconductor device formed on a semiconductor wafer, comprising:
    an output buffer configured to externally output an output signal received from an internal circuit;
    an input buffer configured to output an input signal externally received to said internal circuit;
    a switch configured to control electrical connection between an output terminal of said output buffer and an input terminal of said input buffer;
    a first transmission path provided in a scribe region of said semiconductor wafer and connecting between said output terminal and said switch; and
    a second transmission path provided in said scribe region and connecting between said input terminal and said switch.

2. The semiconductor device according to claim 1, wherein said switch is provided in said scribe region.

3. The semiconductor device according to claim 1, further comprising:
    a test control circuit configured to output a first control signal and a second control signal;
    a first selector provided between said internal circuit and said output buffer; and
    a second selector provided between said internal circuit and said input buffer,
    wherein said first selector selects, depending on said first control signal, one of a test signal from said test control circuit and said output signal from said internal circuit, and outputs the selected one to said output buffer,
    wherein said second selector selects, depending on said second control signal, one of said test control circuit and said internal circuit, and outputs said input signal received from said input buffer to the selected one.

4. The semiconductor device according to claim 3,
    wherein in a test mode, said test control circuit outputs a third control signal to said switch, and said switch controls the electrical connection between said output terminal and said input terminal depending on said third control signal.

5. The semiconductor device according to claim 4,
    wherein in a first test mode, said switch electrically connects between said output terminal and said input terminal, said first selector outputs said test signal to said output buffer, said second selector outputs said input signal received from said input buffer to said test control circuit, and said test control circuit externally outputs a result of comparison between said test signal and said input signal.

6. The semiconductor device according to claim 4,
wherein in a second test mode, said switch electrically disconnects said output terminal and said input terminal from each other, said first selector outputs said output signal received from said internal circuit to said output buffer, and said second selector outputs said input signal received from said input buffer to said internal circuit.

7. The semiconductor device according to claim 4, wherein the semiconductor device is set to a normal mode after dicing said semiconductor wafer,
wherein in said normal mode, said first selector outputs said output signal received from said internal circuit to said output buffer, and said second selector outputs said input signal received from said input buffer to said internal circuit.

8. The semiconductor device according to claim 4,
wherein said switch includes a transistor whose drain and source are connected to said output terminal and said input terminal, and said third control signal is input to a gate of said transistor.

9. A method of testing a semiconductor device,
wherein said semiconductor device, which is formed on a semiconductor wafer, comprises:
an output buffer connected between an internal circuit and an output terminal;
an input buffer connected between said internal circuit and an input terminal;
a switch provided between said output terminal and said input terminal;
a first transmission path connecting between said output terminal and said switch; and
a second transmission path connecting between said input terminal and said switch,
wherein the method includes:
controlling electrical connection between said output terminal and said input terminal by using said switch when performing a test of said semiconductor device before dicing said semiconductor wafer; and
cutting off said first transmission path and said second transmission path at the dicing of said semiconductor wafer.

10. The method according to claim 9,
wherein said controlling includes:
electrically connecting between said output terminal and said input terminal by using said switch to form a loop path passing through said output buffer and said input buffer; and
performing a loopback test by using said loop path.

11. The method according to claim 9,
wherein said controlling includes: electrically disconnecting said output terminal and said input terminal from each other by using said switch; and
connecting an external tester to said output terminal to test output characteristics of said semiconductor device.

12. The method according to claim 9,
wherein said controlling includes:
electrically disconnecting said output terminal and said input terminal from each other by using said switch; and
connecting an external tester to said input terminal to test input characteristics of said semiconductor device.

13. The method according to claim 9,
wherein said controlling includes:
electrically disconnecting said output terminal and said input terminal from each other by using said switch; and
connecting an external tester to said output terminal and said input terminal to perform a function test of said semiconductor device.

* * * * *